United States Patent
Shinada et al.

(10) Patent No.: US 11,495,446 B2
(45) Date of Patent: Nov. 8, 2022

(54) FILM FORMATION DEVICE AND FILM FORMATION METHOD

(71) Applicant: Tokyo Electron Limited, Tokyo (JP)

(72) Inventors: Masato Shinada, Tokyo (JP); Hiroyuki Toshima, Nirasaki (JP); Einstein Noel Abarra, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/050,093

(22) PCT Filed: Mar. 20, 2019

(86) PCT No.: PCT/JP2019/011725
§ 371 (c)(1),
(2) Date: Oct. 23, 2020

(87) PCT Pub. No.: WO2019/208035
PCT Pub. Date: Oct. 31, 2019

(65) Prior Publication Data
US 2021/0118653 A1     Apr. 22, 2021

(30) Foreign Application Priority Data

Apr. 24, 2018 (JP) .............................. JP2018-083255

(51) Int. Cl.
*H01J 37/32* (2006.01)
*C23C 14/34* (2006.01)
(Continued)

(52) U.S. Cl.
CPC ........ *H01J 37/32651* (2013.01); *C23C 14/34* (2013.01); *H01J 37/32715* (2013.01);
(Continued)

(58) Field of Classification Search
None
See application file for complete search history.

(56) References Cited

U.S. PATENT DOCUMENTS

| 2010/0200545 A1* | 8/2010 | Koelmel | C23C 16/4584 216/58 |
| 2013/0206583 A1* | 8/2013 | Druz | H01J 37/3053 204/192.11 |

(Continued)

FOREIGN PATENT DOCUMENTS

| JP | 11-189874 A | 7/1999 |
| JP | 2012-517701 A | 8/2012 |

(Continued)

*Primary Examiner* — Jason Berman
(74) *Attorney, Agent, or Firm* — Nath, Goldberg & Meyer; Jerald L. Meyer; Tanya E. Harkins

(57) ABSTRACT

A film formation device includes a target holder configured to hold a target for emitting sputtering particles in a processing space inside a processing chamber, a sputtering particle emitting part configured to emit the sputtering particles from the target, a sputtering particle shielding plate having a passage hole through which the emitted sputtering particles pass, a shielding member provided to shield the passage hole, a movement mechanism configured to move the shielding member in the horizontal direction, and a controller. The controller controls the shielding member, which has the placement portion on which a substrate is placed, to be moved in one direction of the horizontal direction, and controls the sputtering particles to be emitted from the target. The sputtering particles passed through the passage hole are deposited on the substrate.

8 Claims, 8 Drawing Sheets

(51) Int. Cl.
  *H01J 37/34* (2006.01)
  *H01L 21/02* (2006.01)
  *H01L 21/285* (2006.01)

(52) U.S. Cl.
  CPC .. *H01J 37/32733* (2013.01); *H01J 37/32752* (2013.01); *H01J 37/3435* (2013.01); *H01J 2237/332* (2013.01); *H01L 21/02266* (2013.01); *H01L 21/2855* (2013.01)

(56) References Cited

U.S. PATENT DOCUMENTS

| | | | |
|---|---|---|---|
| 2013/0220551 A1* | 8/2013 | Saito | B05C 13/02 |
| | | | 156/345.55 |
| 2015/0136585 A1* | 5/2015 | Busch | H01J 37/3417 |
| | | | 204/192.13 |
| 2019/0276929 A1* | 9/2019 | Mebarki | C23C 14/352 |

FOREIGN PATENT DOCUMENTS

| | | |
|---|---|---|
| JP | 2015-67856 A | 4/2015 |
| JP | 2016-33266 A | 3/2016 |
| WO | 2013179575 A1 | 12/2013 |

* cited by examiner

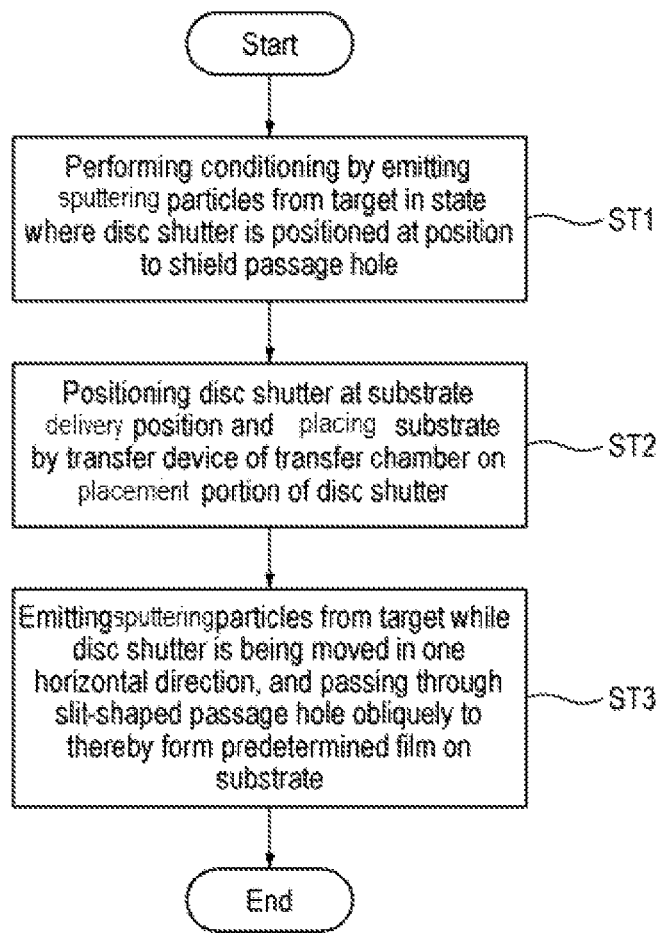

1

FILM FORMATION DEVICE AND FILM FORMATION METHOD

This is a National Phase Application filed under 35 U.S.C. 371 as a national stage of PCT/JP2019/011725, filed Mar. 20, 2019, an application claiming the benefit of Japanese Application No. 2018-083255, filed Apr. 24, 2018, the content of each of which is hereby incorporated by reference in its entirety.

TECHNICAL FIELD

The present disclosure relates to a film formation device and a film formation method.

BACKGROUND

In the manufacture of electronic devices such as semiconductor devices, a film forming process is performed to form a film on a substrate. As a film formation device used in the film forming process, for example, a film formation device as disclosed in Patent Document 1 is known.

The film formation device disclosed in Patent Document 1 is configured as a sputtering device having a vacuum container, a stage for substrate placement provided inside the vacuum container, and a target. The target is provided above the stage. In this film formation device, a film is formed by depositing sputtering particles emitted from the target on a substrate while rotating the stage.

On the other hand, as a technique for implementing film formation having high directionality in which the incidence direction of sputtering particles is aligned with respect to a pattern on a substrate, a technique in which the sputtering particles are obliquely incident on the substrate has been proposed in Patent Document 2.

A film formation device disclosed in Patent Document 2 includes a vacuum container, a substrate holder provided inside the vacuum container, a target holder for holding a target, and a shielding assembly which is provided between the target holder and the substrate holder and has an opening (passage hole). Then, while the substrate holder is being moved by a movement mechanism, the sputtering particles emitted from the target pass through the opening of the shielding assembly and are incident on the substrate at a predetermined angle.

PRIOR ART DOCUMENTS

Patent Documents

Patent Document 1: International Publication No. WO 2013/179575
Patent Document 2: Japanese laid-open publication No. 2015-67856

The present disclosure provides some embodiments of a film formation device and a film formation method which are capable of forming a film by maintaining an incidence angle of sputtering particles while moving a substrate without having to use a separate mechanism.

SUMMARY

A film formation device according to an embodiment of the present disclosure includes: a processing chamber that defines a processing space in which a film forming process is performed on a substrate; a target holder configured to hold a target for emitting sputtering particles in the processing space; a sputtering particle emitting part configured to emit the sputtering particles from the target held by the target holder; a sputtering particle shielding plate having a passage hole through which the emitted sputtering particles pass; a shielding member provided on a side opposite the target holder with the sputtering particle shielding plate interposed between the shielding member and the target holder in the processing space, and configured to shield the passage hole; a movement mechanism configured to move the shielding member in a horizontal direction; and a controller configured to control the sputtering particle emitting part and the movement mechanism, wherein the shielding member includes a placement portion on which the substrate is placed, wherein the controller controls the shielding member, which includes the placement portion on which the substrate is placed, to be moved in one direction of the horizontal direction by the movement mechanism, and controls the sputtering particle emitting part to emit the sputtering particles from the target, and wherein the sputtering particles passed through the passage hole are deposited on the substrate placed on the placement portion to form a film.

According to the present disclosure, it is possible to provide a film formation device and a film formation method which are capable of forming a film by maintaining an incidence angle of sputtering particles while moving a substrate without having to use a separate mechanism.

BRIEF DESCRIPTION OF DRAWINGS

FIG. 3 is a flowchart showing a film formation method performed by the film formation device according to an embodiment.

DETAILED DESCRIPTION

Figure 1:
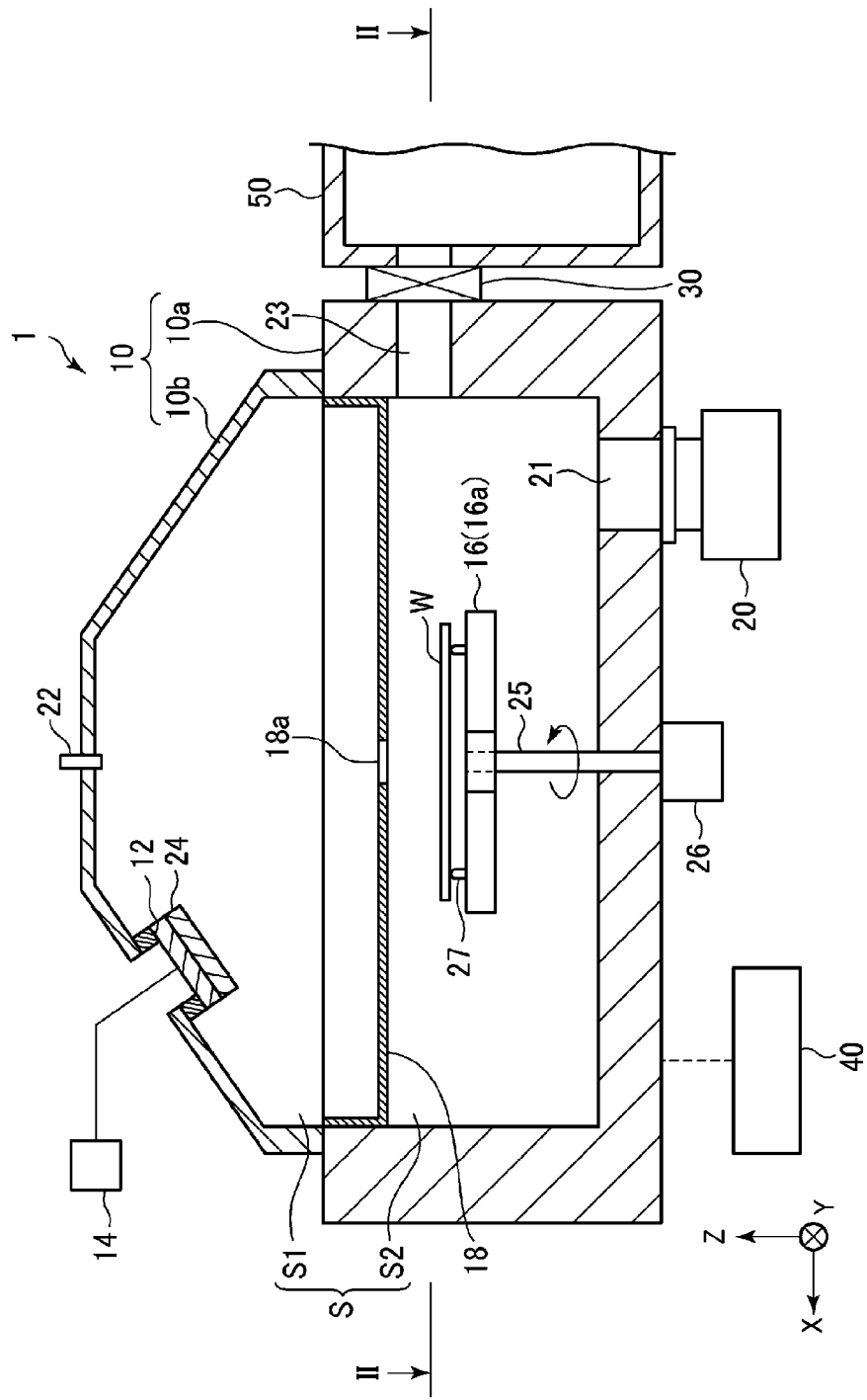
FIG. 1 is a longitudinal cross-sectional view illustrating a film formation device according to an embodiment.
Figure 2:
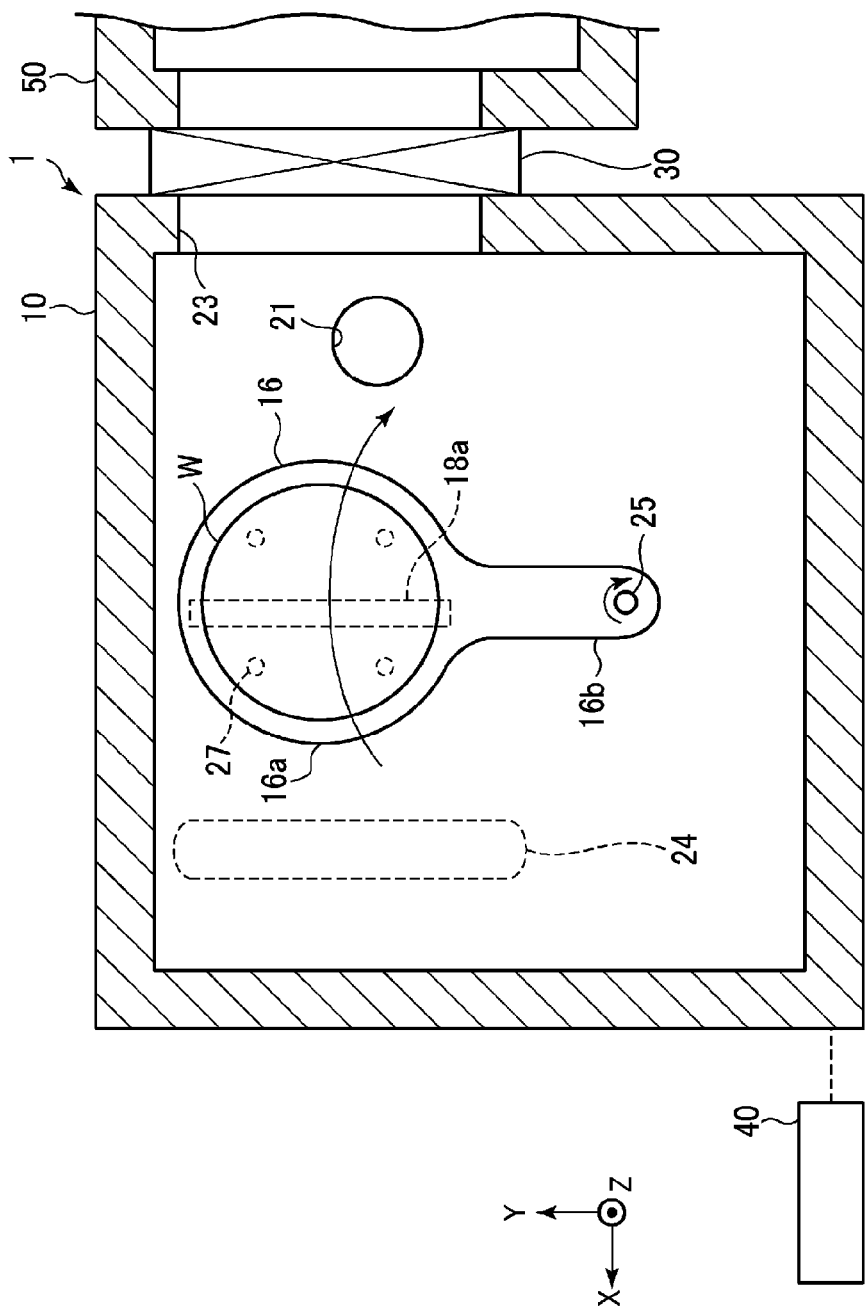
FIG. 2 is a horizontal cross-sectional view taken along line II-II in FIG. 1.

Embodiments will now be described in detail with reference to the accompanying drawings.
FIG. 1 is a longitudinal cross-sectional view illustrating a film formation device according to an embodiment, and FIG. 2 is a horizontal cross-sectional view taken along line II-II of FIG. 1.

A film formation device 1 forms a film on a substrate W by sputtering and includes a processing chamber 10, a target holder 12, a power supply 14, a disc shutter (shielding member) 16, a sputtering particle shielding plate 18, and an exhaust device 20. The substrate W may be, for example, a semiconductor wafer, but is not limited thereto.

The processing chamber 10 has a chamber body 10a with its top opened, and a lid 10b provided so as to close the top opening of the chamber body 10a. The interior of the processing chamber 10 defines a processing space S in which a film forming process is performed.

An exhaust port 21 is formed in the bottom of the processing chamber 10. The exhaust device 20 is connected to the exhaust port 21. The exhaust device 20 includes a pressure control valve and a vacuum pump. The processing space S is evacuated by the exhaust device 20 to a predetermined degree of vacuum.

A gas introduction port 22 for introducing a gas into the processing space S therethrough is formed in the top of the processing chamber 10. A gas from a gas supply part (not shown), for example, an inert gas, is introduced into the processing space S from the gas introduction port 22.

A loading/unloading port 23 for loading/unloading the substrate W therethrough is formed in a sidewall of the processing chamber 10. The loading/unloading port 23 is opened and closed by a gate valve 30. The processing chamber 10 is provided adjacent to a transfer chamber 50. When the gate valve 30 is opened, the processing chamber 10 and the transfer chamber 50 communicate with each other. The interior of the transfer chamber 50 is kept at a predetermined degree of vacuum. The transfer chamber 50 includes a transfer device (not shown) provided therein and configured to load/unload the substrate W into/from the processing chamber 10.

The sputtering particle shielding plate 18 is provided inside the processing chamber 10. The sputtering particle shielding plate 18 is made of substantially a plate-shaped member, and is horizontally disposed at an intermediate position of the processing space S in the height direction. An edge portion of the sputtering particle shielding plate 18 is fixed to the sidewall of the chamber body 10a. The sputtering particle shielding plate 18 partitions the processing space S into a first space S1 and a second space S2. The first space S1 is a space above the sputtering particle shielding plate 18, and the second space S2 is a space below the sputtering particle shielding plate 18.

The sputtering particle shielding plate 18 is formed with a slit-shaped passage hole 18a that allows sputtering particles to pass through. The passage hole 18a penetrates the sputtering particle shielding plate 18 in the plate thickness direction (Z direction in FIG. 1). The passage hole 18a is formed in an elongated shape in the Y direction, which is one horizontal direction in FIG. 1, as a longitudinal direction. The length of the passage hole 18a in the Y direction is formed to be longer than the diameter of the substrate W. In order to improve the controllability of the incidence angle of the sputtering particles passing through the passage hole 18a with respect to the substrate, fins as a collimator function may be provided around the passage hole 18a.

The target holder 12 is disposed above the sputtering particle shielding plate 18 and is made of a conductive material. The target holder 12 is attached to the processing chamber 10 (the lid 10b in this example) via an insulating member.

The target holder 12 is configured to hold a target 24 in the first space S1. The target holder 12 holds the target 24 so that the target 24 is located obliquely above the passage hole 18a. The target 24 is made of a material containing a constituent element of a film to be formed and may be a conductive material or a dielectric material.

The power supply 14 is electrically connected to the target holder 12. The power supply 14 may be a DC power supply when the target 24 is a conductive material, and may be a high frequency power supply when the target 24 is a dielectric material. When the power supply 14 is the high frequency power supply, the power supply 14 is connected to the target holder 12 via a matching device. When a voltage is applied to the target holder 12, a gas dissociates around the target 24. Then, ions in the dissociated gas collide with the target 24, so that sputtering particles, which are particles of the constituent material, are emitted from the target 24.

The disc shutter 16 is provided in the second space S2 of the processing chamber 10. The disc shutter 16 has a function of shielding the passage hole 18a of the sputtering particle shielding plate 18 during conditioning or the like to prevent the sputtering particles from diffusing in the second space S2.

The disc shutter 16 is formed in a paddle shape having a circular body portion 16a that shields the passage hole 18a, and an extension portion 16b that extends from the body portion 16a. The extension portion 16b is fixed to a rotary shaft 25 extending in the Z direction. The rotary shaft 25 is rotated by a drive mechanism 26 such as a motor provided below the processing chamber 10. Then, by rotating the rotary shaft 25 by the drive mechanism 26, the disc shutter 16 is rotated in a horizontal plane. That is, the disc shutter 16 is movable in the horizontal direction and is moved between a shielding position in which the passage hole 18a is shielded and a position different from the shielding position.

The disc shutter 16 is a member that is conventionally placed in a film formation device of this type, but in the present embodiment, the disc shutter 16 has a function as a substrate stage. Therefore, the film formation device 1 of the present embodiment does not have a dedicated substrate stage that has been used conventionally.

The disc shutter 16 has a plurality of (for example, four) substrate support pins 27 for supporting the substrate W on the body portion 16a. The body portion 16a functions as a placement portion on which the substrate W is placed. Then, the substrate W is transferred to and from the substrate support pins 27 by the transfer device of the transfer chamber 50 with the disc shutter 16 positioned at a predetermined position.

The substrate W supported on the substrate support pins 27 can be moved in one horizontal direction intersecting the slit-shaped passage hole 18a using a rotation mechanism of the disc shutter 16. Although this one horizontal direction is in an arc shape, when the substrate W passes through the passage hole 18a, the movement direction of the substrate W is substantially orthogonal to the longitudinal direction of the passage hole 18a.

A heater for heating the substrate W may be built in the disc shutter 16. Further, the disc shutter 16 may be provided with an electrostatic attraction mechanism to electrostatically attract the substrate W. Further, various sensors such as a temperature sensor, an electrostatic sensor, and the like may be built in the disc shutter 16.

The film formation device 1 further includes a controller 40. The controller 40 includes a computer and has a main control part including a CPU that controls various components of the film formation device 1, for example, the power supply 14, the exhaust device 20, the drive mechanism 26, and the like, an input device such as a keyboard, a mouse, and or the like, an output device, a display device, and a storage device. When a storage medium in which a processing recipe is stored is set in the storage device, the main control part of the controller 40 controls the film formation device 1 to perform a predetermined operation based on the processing recipe called from the storage medium.

Figure 4A:
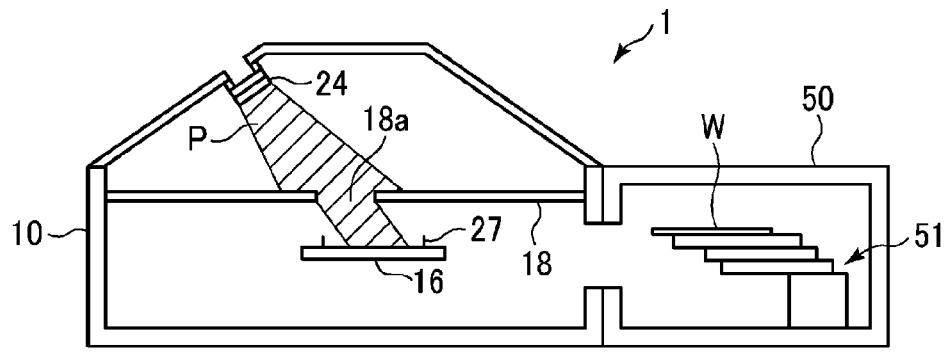
FIG. 4A is a cross-sectional process view schematically illustrating a step ST1 of the film formation method performed by the film formation device according to an embodiment.
Figure 4B:
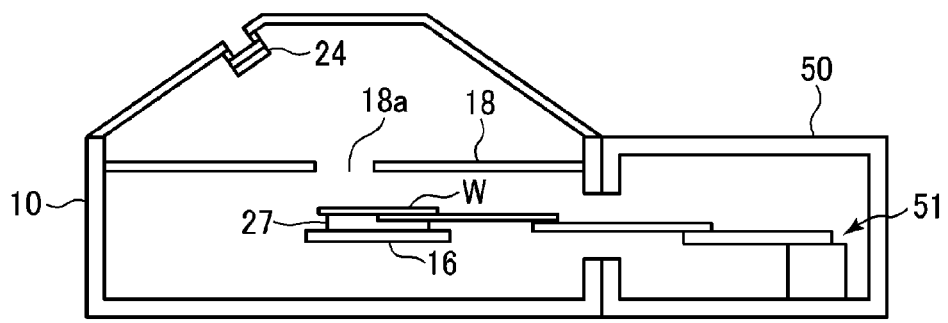
FIG. 4B is a cross-sectional process view schematically illustrating a step ST2 of the film formation method performed by the film formation device according to an embodiment.
Figure 4C:
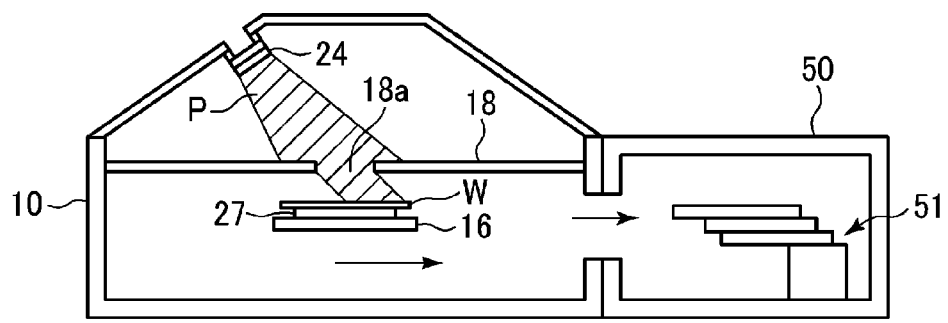
FIG. 4C is a cross-sectional process view schematically illustrating a step ST3 of the film formation method performed by the film formation device according to an embodiment.

Next, a film formation method (processing operation of the film formation device) by the film formation device configured as above will be described. FIG. 3 is a flowchart illustrating the film formation method performed by the film formation device according to an embodiment, and FIGS. 4A to 4C are cross-sectional process views illustrating respective steps of the film formation method.

First, after the processing space S in the processing chamber 10 is exhausted, for example, the inert gas is introduced into the processing space S from the gas introduction port 22 to adjust an internal pressure of the processing space S to a predetermined pressure. Then, in a state where the disc shutter 16 is positioned at the shielding position in which the slit-shaped passage hole 18a is shielded, a voltage is applied from the power supply 14 so that the sputtering particles P are emitted from the target 24 to perform the conditioning (step ST1, FIG. 4A). At this time, it is preferable that the substrate support pins 27 are positioned at such places as to avoid the passage hole 18a so that sputtering particles are not deposited on the substrate support pins 27.

Subsequently, the disc shutter 16 is positioned at a substrate delivery position, the gate valve 30 is opened, and the substrate W is placed by a transfer device 51 of the transfer chamber 50 on the placement portion (on the substrate support pins 27) of the disc shutter 16 (step ST2, FIG. 4B).

Subsequently, the transfer device 51 is returned to the transfer chamber 50. While the disc shutter 16 is being moved in one horizontal direction (arrow direction), the sputtering particles P are emitted from the target and pass through the slit-shaped passage hole 18a obliquely at a predetermined angle so that a predetermined film is formed on the substrate W (step ST3, FIG. 4C). The movement direction of the disc shutter 16 at this time is in an arc shape, but is a direction substantially orthogonal to the longitudinal direction (Y direction) of the passage hole 18a. The sputtering particles are emitted by applying the voltage from the power supply 14 to the target holder 12 to collide ions in a gas dissociated around the target 24 with the target 24.

By forming the film in this way, it is possible to perform the oblique formation of the film on the entire surface of the substrate W in a state where the incidence angle of the sputtering particles is kept substantially constant.

In the case of the oblique film formation, it is necessary to move the substrate in one direction during film formation in order to form a film on the entire surface of the substrate while keeping the incidence angle of the sputtering particles substantially constant. For this reason, in Patent Document 2, a mechanism for moving the substrate stage is additionally provided.

On the other hand, in the present embodiment, the oblique film formation is performed while moving the substrate W using the existing movement mechanism of the disc shutter 16. Therefore, the oblique film formation can be performed without using the additional mechanism for moving the substrate.

At this time, since the disc shutter 16 is rotated, a movement trajectory of the substrate W has an arc shape. For this reason, if the width of the slit-shaped passage hole 18a is wide, the film formation is performed in bilaterally asymmetric manner. Accordingly, it is preferable to set the width of the passage hole 18a to such a narrow width as not to cause the bilaterally asymmetric film formation. In addition, paying attention to the fact that the movement speed of the substrate is different between a position corresponding to the outer circumference and a position corresponding to the inner circumference of the arc that is the substrate movement trajectory, a fan-shaped slit shape extending the outer circumference of the arc may be employed for the purpose of aligning the exposure time to the slit per unit area of the substrate.

Figure 5:
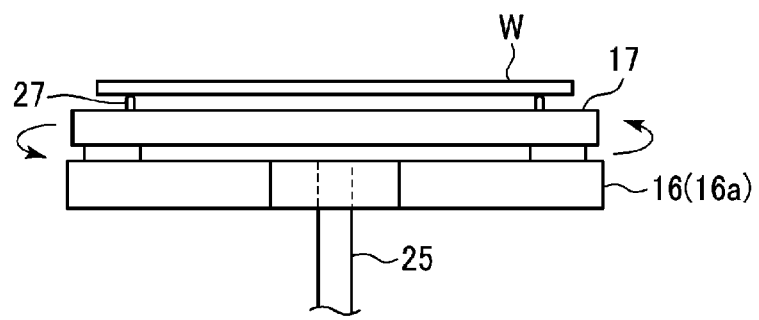
FIG. 5 is a cross-sectional view illustrating an example in which a disc shutter is provided with a turntable.

Further, as illustrated in FIG. 5, the substrate W may be placed on the disc shutter 16 via a turntable 17 so that the substrate W can be rotated. By providing the turntable 17, the substrate W can be rotated when the disc shutter 16 is rotated, so that the incidence direction of the sputtering particles with respect to the substrate W becomes constant depending on the position of the substrate.

Figure 6:
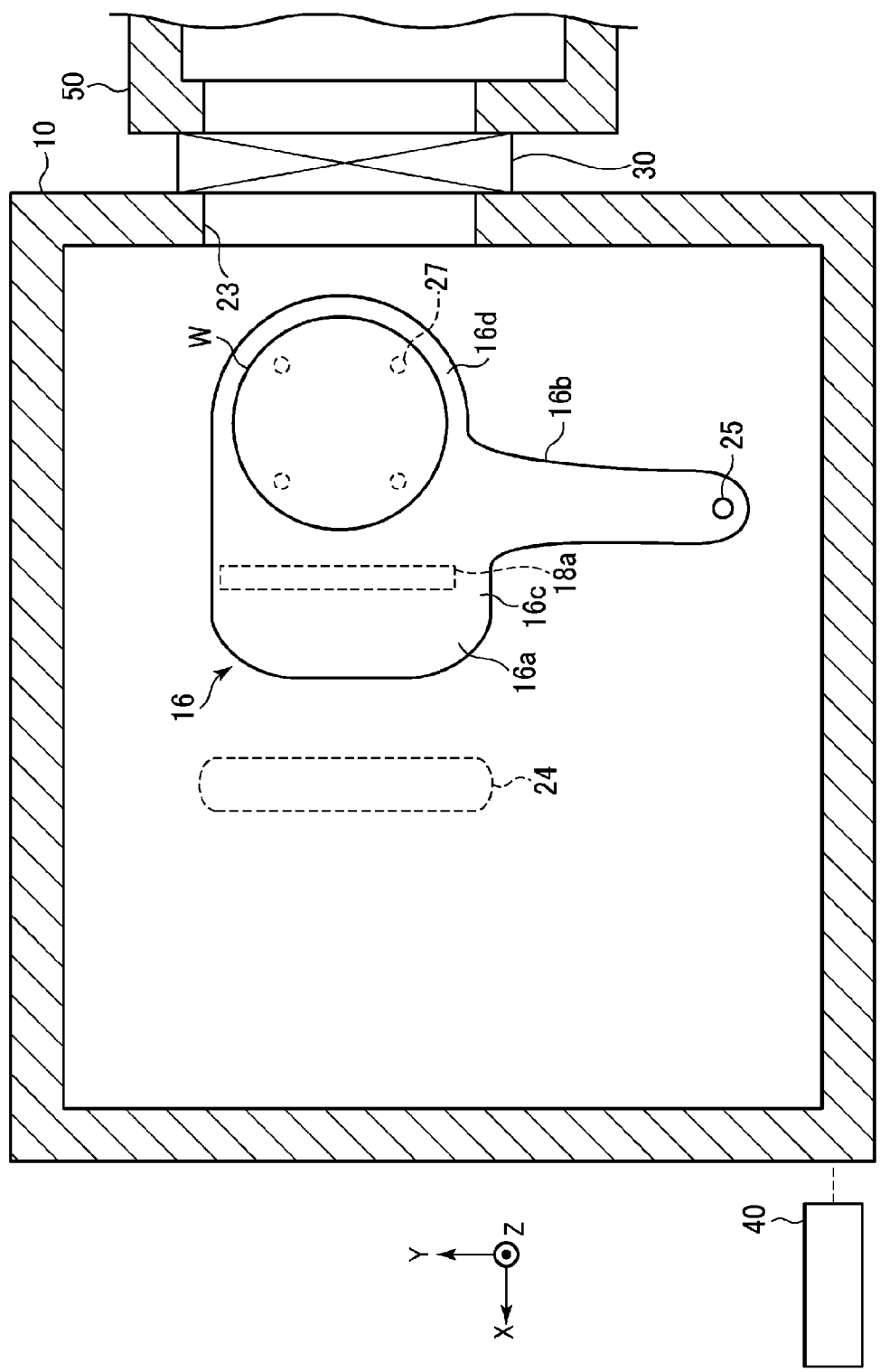
FIG. 6 is a horizontal cross-sectional view illustrating a modification of the disc shutter.

As illustrated in FIG. 6, in the disc shutter 16, the body portion 16a may separately include a shielding portion 16c for shielding the passage hole 18a, and a placement portion 16d on which the substrate W is placed. By doing so, it is possible to perform the conditioning by shielding the slit 18a by the shielding portion 16c while the substrate W is placed on the placement portion 16d of the disc shutter 16. Accordingly, it is not necessary to place the substrate W after the conditioning, which can simplify the process.

Figure 7:
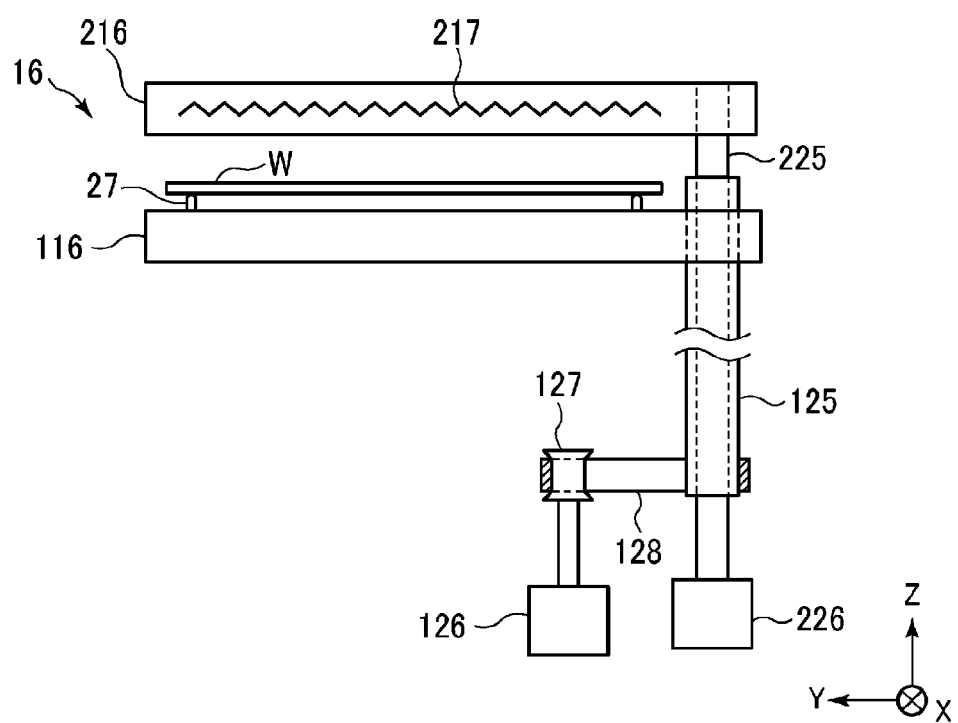
FIG. 7 is a view illustrating a disc shutter of a film formation device according to another embodiment.

Next, another embodiment will be described. FIG. 7 is a view illustrating a disc shutter of a film formation device according to another embodiment.

In the present embodiment, a disc shutter 16 has a configuration in which a lower first member 116 and an upper second member 216 each having an independent rotation axis are arranged in upper and lower two stages. The lower first member 116 has a placement portion for the substrate W, and the upper second member 216 has another function.

The first member 116 is fixed to a rotary shaft 125 extending in the Z direction. The rotary shaft 125 is rotated by a drive mechanism 126 such as a motor or the like via a pulley 127 and a belt 128. The second member 216 is fixed to a rotary shaft 225 coaxially provided inside the rotary shaft 125. The rotary shaft 225 is rotated by a drive mechanism 226 such as a motor or the like. Then, the rotary shaft 125 is rotated by the drive mechanism 126, so that the first member 116 is rotated in the horizontal plane. Further, the rotary shaft 225 is rotated by the drive mechanism 226, so that the second member 216 is rotated in the horizontal plane. In this way, the first member 116 and the second member 216 are independently rotated by different drive mechanisms.

In this example, the substrate W is placed on the first member 116, and a heater 217 is provided in the second member 216. Further, the second member 216 can be rotated at a proper timing to be positioned above the first member 116 so that the substrate W can be heated. By heating from above, heat applied to the substrate can be minimized and heat necessary for film formation can be applied. The second member 216 may be provided with sensors such as a temperature sensor, an electrostatic sensor, and the like to detect the state of the substrate W.

Further, the second member 216 may have other function, such as a source of a reactive gas such as oxygen or nitrogen, or an energy source such as UV or electron beam. By doing so, it becomes possible to carry out oxidation/nitridation of a sputtered film, and cleaning of the substrate surface based on the organic substance decomposition effect by UV irradiation, without unloading the substrate from the processing chamber after sputtering. It is also effective to combine the reactive gas source and the energy source. Since a local space is formed between the first member 116 and the second member 216, it becomes possible to adjust the pressure locally by supplying a gas into the local space, and supply an ionized gas to the substrate by irradiating the reactive gas with UV or the like. Therefore, the reaction of the sputtered film can be promoted under the optimal conditions. Further, one of the first member 116 and the second member 216 may have a function of placing the substrate W thereon and moving the substrate W, and the other may have a function of shielding the slit-shaped passage hole 18a.

In this way, by making the disc shutter 16 in a structure having the first member 116 and the second member 216 that are movable independently of each other, it is possible to perform a process at a high degree of freedom.

Although FIG. 7 illustrates an example in which the rotary shaft 125 and the rotary shaft 225 are provided in a coaxial relationship with each other, they may be provided separately.

Figure 8:
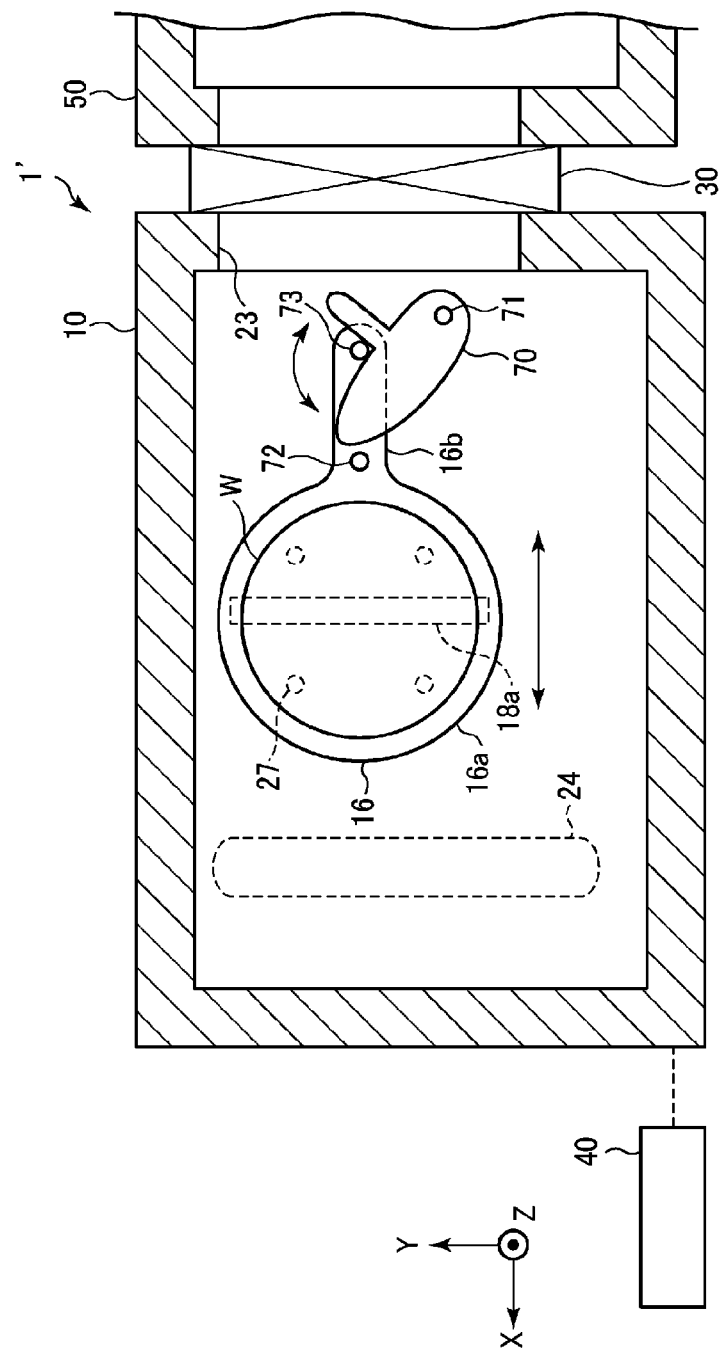
FIG. 8 is a horizontal cross-sectional view illustrating a film formation device according to still another embodiment.

Next, still another embodiment will be described. FIG. 8 is a horizontal cross-sectional view illustrating a film formation device according to still another embodiment.

A film formation device 1' of this embodiment is different from the above embodiments in a method of driving the disc shutter 16. Similarly to the above embodiments, the disc shutter 16 of this embodiment has a paddle shape having a circular body portion 16a that shields the slit-shaped passage hole 18a, and an extension portion 16b extending from the body portion 16a. However, the extension portion 16b extends in the X direction, and two pins 72 and 73 stand on the extension portion 16b. A cam 70 is provided so as to be rotated by a rotary shaft 71 through a drive mechanism (not shown). The disc shutter 16 is linearly driven via the pins 72 and 73 by the rotation of the cam 70 with the rotary shaft 71 as a fulcrum. The disc shutter 16 is movably supported by an appropriate support mechanism (not shown).

With such a configuration, the function of the disc shutter 16 can be realized with a simplified configuration. Further, at the time of film formation, with the substrate W placed on the disc shutter 16, the emitted sputtering particles obliquely pass through the slit-shaped passage hole 18a at a predetermined angle while the disc shutter 16 is being moved in one direction, so that a predetermined film is formed on the substrate W.

In the present embodiment, since the disc shutter 16 can be moved linearly, the film formation is not performed in a bilaterally asymmetric manner when the film is formed by placing the substrate W on the disc shutter 16 and moving the substrate W.

In the above, the embodiments have been described. However, it should be noted that the embodiments disclosed herein are exemplary in all respects and are not restrictive. The above-described embodiments may be omitted, replaced or modified in various forms without departing from the scope and spirit of the appended claims.

For example, the method of emitting the sputtering particles in the above embodiments is an example, and the sputtering particles may be emitted by another method. Further, in the above embodiments, an example in which the target is disposed obliquely has been illustrated, but the present disclosure is not limited thereto.

EXPLANATION OF REFERENCE NUMERALS

1: film formation device, 10: processing chamber, 10a: chamber body, 10b: lid, 12: target holder, 16: disc shutter (shielding member), 18: sputtering particle shielding plate, 18a: passage hole, 20: exhaust mechanism, 22: gas introduction port, 24: target, 25, 125, 225: rotary shaft, 26, 126, 226: drive mechanism, 27: substrate support pin, S: processing space, S1: first space, S2: second space, W: substrate

What is claimed is:

1. A film formation device comprising:
    a processing chamber that defines a processing space in which a film forming process is performed on a substrate;
    a target holder configured to hold a target for emitting sputtering particles in the processing space;
    a sputtering particle emitting part configured to emit the sputtering particles from the target held by the target holder;
    a sputtering particle shielding plate having a passage hole through which the emitted sputtering particles pass;
    a shielding member provided on a side opposite the target holder with the sputtering particle shielding plate interposed between the shielding member and the target holder in the processing space, and configured to shield the passage hole;
    a movement mechanism configured to move the shielding member in a horizontal direction; and
    a controller configured to control the sputtering particle emitting part and the movement mechanism,
    wherein the shielding member includes a placement portion on which the substrate is placed,
    wherein the controller controls the shielding member, which includes the placement portion on which the substrate is placed, to be moved in one direction of the horizontal direction by the movement mechanism, and controls the sputtering particle emitting part to emit the sputtering particles from the target,
    wherein the sputtering particles passed through the passage hole are deposited on the substrate placed on the placement portion to form a film,
    wherein the shielding member is fixed to a rotary shaft at a location other than a center of the placement portion and the movement mechanism rotates the rotary shaft to rotate the shielding member about the rotary shaft,
    wherein the shielding member has a paddle shape, which includes a body portion serving as the placement portion and an extension portion extending from the body portion, and
    wherein the shielding member is fixed to the rotary shaft at the extension portion.

2. The film formation device of claim 1, wherein the placement portion has a plurality of substrate support pins configured to support the substrate.

3. The film formation device of claim 1, wherein the passage hole has a slit shape, and the movement mechanism is configured to move the shielding member in one direction intersecting with the passage hole.

4. The film formation device of claim 1, wherein the shielding member includes a turntable configured to rotate the substrate, and the substrate is rotated by the turntable when the shielding member is rotated by the movement mechanism.

5. The film formation device of claim 1, wherein the movement mechanism is configured to linearly move the shielding member.

6. The film formation device of claim 1, wherein the shielding member includes a shielding portion that shields the passage hole, separately from the placement portion on which the substrate is placed.

7. A method of forming a predetermined film using a film formation device, wherein the film formation device includes:

a processing chamber that defines a processing space in which a film forming process is performed on a substrate;

a target holder configured to hold a target for emitting sputtering particles in the processing space;

a sputtering particle emitting part configured to emit the sputtering particles from the target held by the target holder;

a sputtering particle shielding plate having a passage hole through which the emitted sputtering particles pass;

a shielding member provided on a side opposite the target holder with the sputtering particle shielding plate interposed between the shielding member and the target holder in the processing space, and configured to shield the passage hole; and a movement mechanism configured to move the shielding member in a horizontal direction, wherein the shielding member includes a placement portion on which the substrate is placed, wherein the shielding member is fixed to a rotary shaft at a location other than a center of the placement portion, wherein the shielding member has a paddle shape, which includes a body portion serving as the placement portion and an extension portion extending from the body portion, and wherein the shielding member is fixed to the rotary shaft at the extension portion, the method comprising:

mounting the substrate on the placement portion of the shielding member; and moving, by the movement mechanism, the shielding member including the placement portion on which the substrate is placed in one direction of the horizontal direction, emitting, by the sputtering particle emitting part, the sputtering particles from the target, and depositing the sputtering particles passed through the passage hole on the substrate placed on the placement portion, wherein the moving the shielding member includes rotating, by the movement mechanism, the rotary shaft to rotate the shielding member about the rotary shaft.

8. The method of claim 7, further comprising: prior to mounting the substrate, performing a conditioning by emitting the sputtering particles from the target in a state in which the shielding member is moved to a position at which the passage hole is shielded.

* * * * *